United States Patent [19]
Cheng

[11] Patent Number: 5,798,660
[45] Date of Patent: Aug. 25, 1998

[54] CASCODED DIFFERENTIAL PAIR AMPLIFIER WITH CURRENT INJECTION FOR GAIN ENHANCEMENT

[75] Inventor: Michael C. H. Cheng, Singapore, Singapore

[73] Assignee: Tritech Microelectronics International Pte Ltd., Singapore, Singapore

[21] Appl. No.: 663,571

[22] Filed: Jun. 13, 1996

[51] Int. Cl.$^6$ ................................................. H03K 5/22
[52] U.S. Cl. ........................ 327/65; 327/89; 327/563; 330/311
[58] Field of Search ........................... 330/253, 311, 330/261; 327/63, 65–67, 77, 89, 560–563

[56] References Cited

U.S. PATENT DOCUMENTS

| | | | |
|---|---|---|---|
| 4,481,478 | 11/1984 | Flink et al. | 330/253 |
| 4,881,044 | 11/1989 | Kinoshita et al. | 330/253 |
| 5,034,700 | 7/1991 | Herrmann et al. | 330/253 |
| 5,047,665 | 9/1991 | Burt | 330/311 |
| 5,070,306 | 12/1991 | Okamoto | 330/253 |
| 5,362,995 | 11/1994 | Kubo | 327/65 |
| 5,442,318 | 8/1995 | Badyal et al. | 330/253 |

FOREIGN PATENT DOCUMENTS

| | | | |
|---|---|---|---|
| 0121688 | 10/1984 | European Pat. Off. | 330/253 |
| 0010904 | 1/1985 | Japan | 330/253 |

OTHER PUBLICATIONS

"MOS Sampled Data Recursive Filters Using Switched Capacitor Integrators" by Hosticka et al, IEEE Journal of Solid State Circuits, vol. SC-12, No. 6, Dec. 1977, pp. 250–258.

Primary Examiner—Toan Tran
Attorney, Agent, or Firm—George O. Saile; Stephen B. Ackerman

[57] ABSTRACT

A cascoded differential amplifier with a circuit for the injection of current to enhance the gain is described. The differential amplifier includes a differential pair of n-MOS FET's connected to a current source an a positive and a negative input terminal. A pair of isolation n-MOS FET's are inserted between the differential pair and a pair of current source loads. These isolate the current source loads from the differential pair. A current injector is connected to the drains of the n-MOS FET's of the differential pair. The isolation n-MOS FET's and the injected currents enhance the gain of the differential amplifier. A level translation circuit adjusts the output levels of the differential pair to levels required by circuitry attached to the output terminals of the level translation circuitry. A voltage biasing generation circuit creates bias voltages necessary to establish the currents through the differential amplifier, the amounts of injection current, the level the load currents, and the output voltage levels of the level translation circuit.

15 Claims, 4 Drawing Sheets

FIG. 1 - Prior Art

CASCODED DIFFERENTIAL PAIR AMPLIFIER WITH CURRENT INJECTION FOR GAIN ENHANCEMENT

BACKGROUND OF THE INVENTION

1. Field Of The Invention

This invention relates to the design of differential amplifiers that are fabricated from Field Effect Transistors (FET) and in particular the factors of the design that relate to the enhancement of the gain of single stage cascoded differential amplifiers.

2. Description of Related Art

Differential amplifiers are incorporated in the design and fabrication of large scale integrated circuits. These differential amplifiers are the essential building blocks for such application as high resolution, high clock rate sample and hold structures and data converters.

A single channel Metal Oxide Semiconductor (MOS) cascaded stages amplifier design as described in "MOS Sampled Data Recursive Filters Using Switched Capacitor Integrators" by Hosticka, et al., IEEE Journal of Solid State Circuits Vol. SC-12, No. 6 Dec. 1977, pp 250–258 is shown in FIG. 1. The input stage is a single ended amplifier formed by n-channel MOS (n-MOS) FET's M1, M2, M3, and M4. The input stage is followed by a level shifter formed by n-MOS FET's M8 and M9 which is driving the main gain stage formed by n-MOS FET's M10, M1, M12, M13, M14, M15, and M16. The transconductance of the drive transistor M10 is enhanced by the adding of the current source M11 and M12 which injects more DC bias current into M10 and increasing the DC bias current for M16 through M15, thus enhancing the total gain for the stage. The n-MOS FET M3, wired in a common gate configuration, isolates the load device M14 from the driver transistor M10. The output stage formed by n-MOS FET's M17 and M18 are connected in a push-pull driver configuration, but the main gain stage, FET's M10, M1, M12, M13, M14, M15, and M16, has so much gain that M18 is acting as a source follower with M17 as a load.

The circuit is designed so as to be immune to threshold voltage variations. The quiescent voltages through the amplifier are made to track the voltages generated by the bias voltage string M5, M6, and M7.

FIG. 1 illustrates a single channel depletion and enhancement device MOS design with cascaded stages and is not suitable for commercially available CMOS process and high frequency application.

U.S. Pat. No. 5,070,306 (issued Dec. 3, 1991 to Okamoto for a "High-Gain Differential Amplifier Circuit Fabricated From Field Effect Transistors") describes a technique for the improvement of the gain of differential amplifiers by the controlling of the transconductance of the load transistors of each side of the differential pair.

U.S. Pat. No. 5,442,318 (issued Aug. 15, 1995 to Badyal, et al. for "Gain Enhancement Technique for Operational Amplifiers") shows a circuit technique for the enhancement of the gain of operational amplifiers by the coupling of the input differential amplifier to a cascoded current source and feeding back of the output common mode noise to the input operational amplifier to improve the common mode noise rejection ratio.

SUMMARY OF THE INVENTION

An object of this invention is the creation of a single stage, cascoded differential amplifier of a Complementary Metal Oxide Semiconductor (CMOS) design with enhanced gain for high frequency applications. Furthermore, another object of this invention is the cascoded differential amplifier capable of operation in high gain, high clock rate, sample and hold and data conversion circuits at power supply level below 3 V.

According to the present invention a single stage, cascoded differential amplifier consists of an amplifier section, a current injection section, and a voltage biasing section. The fully differential amplifier section will amplify the difference of the magnitude of a positive and a negative input voltages. The amplifier section consists of a differential pair of n-MOS FET's with their sources coupled together and connected to a current source. The gate of the first n-MOS FET of the differential pair is connected to the positive input voltage and the second n-MOS FET of the differential pair is connected to the negative input voltage. The drains of the pair of n-MOS FET's are connected to a second pair of n-MOS FET's which isolate the first pair of n-MOS FET's from a first pair of p-channel Metal Oxide Semiconductor (p-MOS) FET's that are configured as current source loads of the amplifier section. The second pair of n-MOS FET's and the first pair of p-MOS FET's are connected to a second pair of p-MOS FET's and a third and fourth pair of n-MOS FET's acting as cascode current sources that are configured as a level translation and buffer circuitry that will buffer and isolate a positive output terminal and a negative output terminal from the differential pair of n-MOS FET's and so as to deliver the desired output signal swing at the positive and negative output terminals.

The current injection section is formed by two pairs of p-MOS FET's configured as current sources. These current sources inject current into the drains of the differential pair of the differential amplifier section thus maintaining or increasing the transconductance of the amplifier section.

The voltage biasing section provide the voltages necessary to establish the correct current in the current sources of the amplifier section and the current injection section. The voltage biasing also provides the necessary voltage biases to establish the positive and negative output voltage range at the positive and negative output terminals in the level translation and buffer circuitry of the amplifier section.

DETAILED DESCRIPTION OF THE INVENTION

Figure 1:
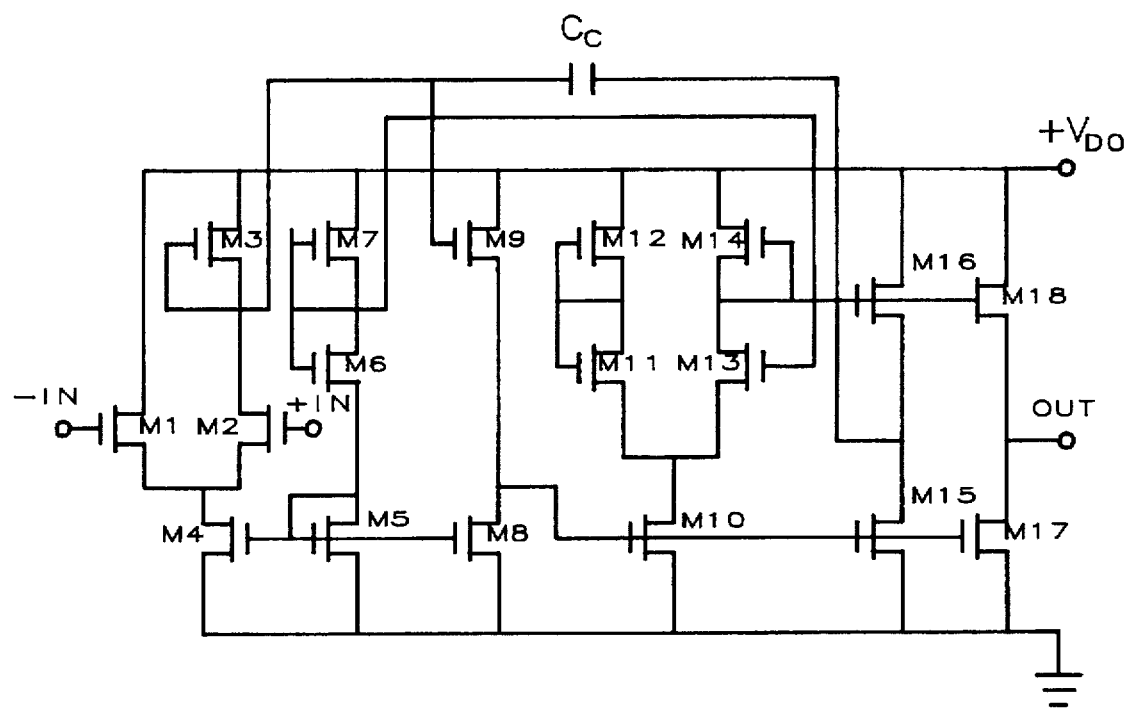
FIG. 1 is a schematic diagram of an n-MOS differential amplifier design of prior art having current injection for gain enhancement.
Figure 2:
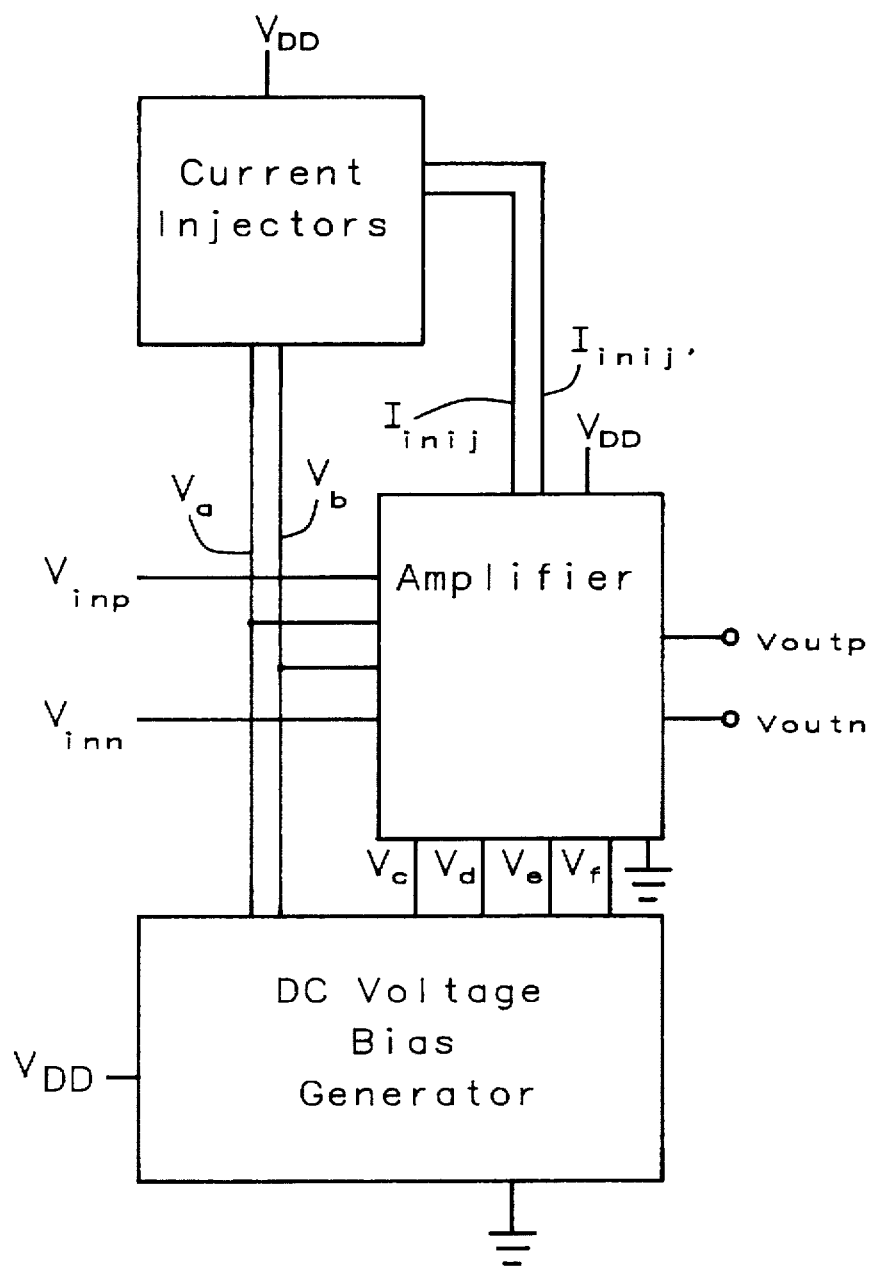
FIG. 2 is a block diagram of the functions of a differential amplifier with current injection for gain enhancement of the present invention.

Referring to FIG. 2, the amplifier section boosts the magnitude of the difference of the voltages Vinp and Vinn and places this difference on the output terminals Voutp and Voutn. In order to enhance the gain of the amplifier, the current injection section generates currents $I_{inj}$ and $I_{inj'}$ to augment the current in the amplifier section. The dc voltage biasing generator enables low voltage operation and establishes the voltages $V_a$, $V_b$, $V_c$, $V_d$, $V_e$, and $V_f$, which adjust the levels of the injection currents $I_{inj}$ and $I_{inj'}$, and the levels of the currents within the amplifier section that determine the gain of the amplifier, and the desired signal swing of the Voutp and Voutn. This structure also allows the single stage, cascoded differential amplifier circuit of this invention to operate with voltage supply levels from Vdd to ground of 3.0 V and below.

Figure 3:
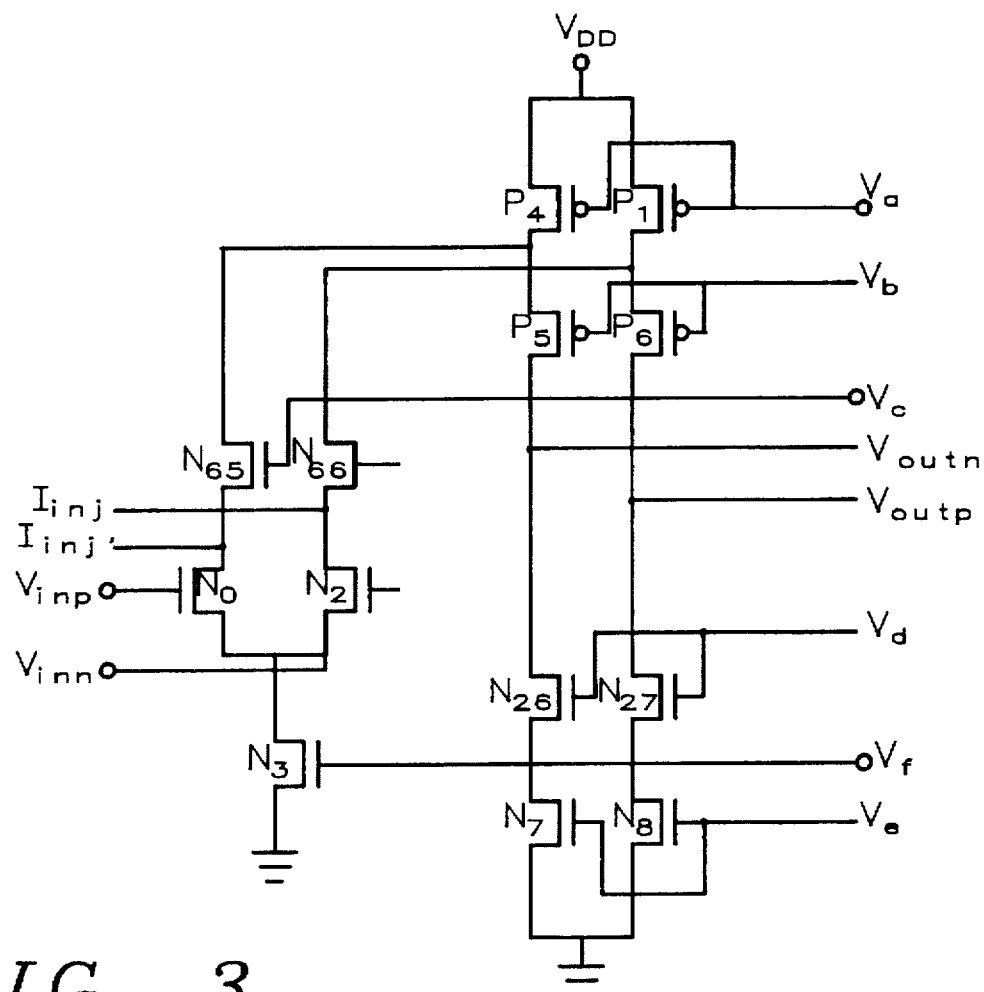
FIG. 3 is a schematic diagram of the amplifier section of the present invention.

FIG. 3 is a schematic diagram of the amplifier section of FIG. 2. The n-MOS FET's $N_0$ and $N_2$ form a differential pair with their sources connected and coupled to the current source formed by n-MOS FET $N_3$. The voltage $V_f$ establishes the current level of the current source.

The gate of $N_0$ is connected to Vinp and the gate of $N_2$ is connected to Vinn. The n-MOS FET's $N_{65}$ and $N_{66}$ serve to isolate the differential pair $N_0$ and $N_2$ from their current source loads formed by p-MOS FET's $P_4$ and $P_1$. This isolation enables the transconductance of the differential pair to be maintained or even increased by the injection of currents $I_{inj}$ and $I_{inj'}$ to the drains of $N_0$ and $N_2$ respectively. The current injections does not shunt off the original load current of $N_0$ and $N_2$ from the current source loads $P_4$ and $P_1$ respectively, since the isolation provided by $N_{65}$ and $N_{66}$ create a low impedance node at the drain of $N_0$ and $N_2$. The gate bias for $N_{65}$ and $N_{66}$ to provide the isolation is established by the bias voltage $V_c$.

By utilizing the injected currents $I_{inj}$ and $I_{inj'}$ to augment the transconductance of $N_0$ and $N_2$, less current needs to be drawn from the current source loads $P_4$ and $P_1$. This lowers the output conductance of $P_4$ and $P_1$, thus enhancing the overall gain of the single stage amplifier section.

The voltage $V_a$ is used to established the current levels within the current source loads $P_4$ and $P_1$. The p-MOS FET's $P_5$ and $P_6$ with the n-MOS FET's $N_{26}$, $N_{27}$, $N_7$, and $N_8$ form a network to buffer and translate the output voltages Voutn and Voutp from the input differential pair. The appropriate operating bias for the p-MOS FET's $P_5$ and $P_6$ and n-MOS FET's $N_{26}$, $N_{27}$, $N_7$, and $N_8$ are established by the voltages $V_b$, $V_d$, and $V_e$ which determines the output signal swing at $V_{outn}$ and $V_{outp}$.

Figure 4:
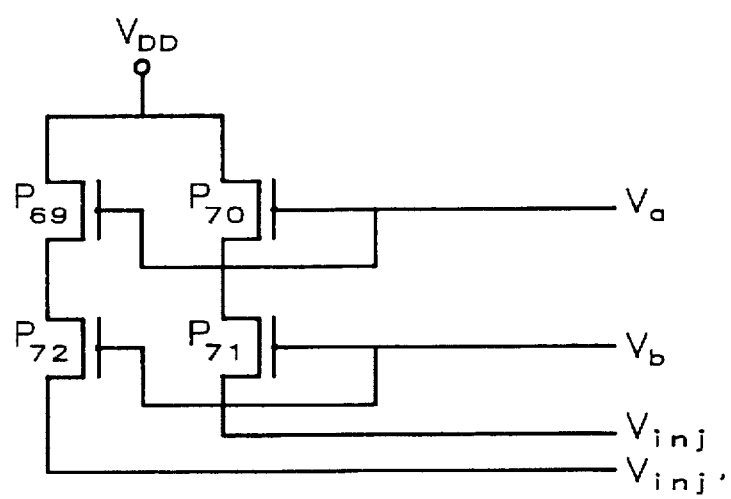
FIG. 4 is a schematic diagram of the current injection section of the present invention.

The generation of the injected currents $I_{INJ}$ and $I_{INJ'}$ is shown in FIG. 4. The p-MOS FET's $P_{69}$ and $P_{70}$ form a current source with their sources connected to the voltage power supply $V_{DD}$. The p-MOS FET's $P_{71}$ and $P_{72}$ are the cascoded respectively with p-MOS FET's $P_{70}$ and $P_{69}$. The bias voltages $V_a$ and $V_b$ establish the level of the currents $I_{INJ}$ and $I_{INJ'}$.

Figure 5:
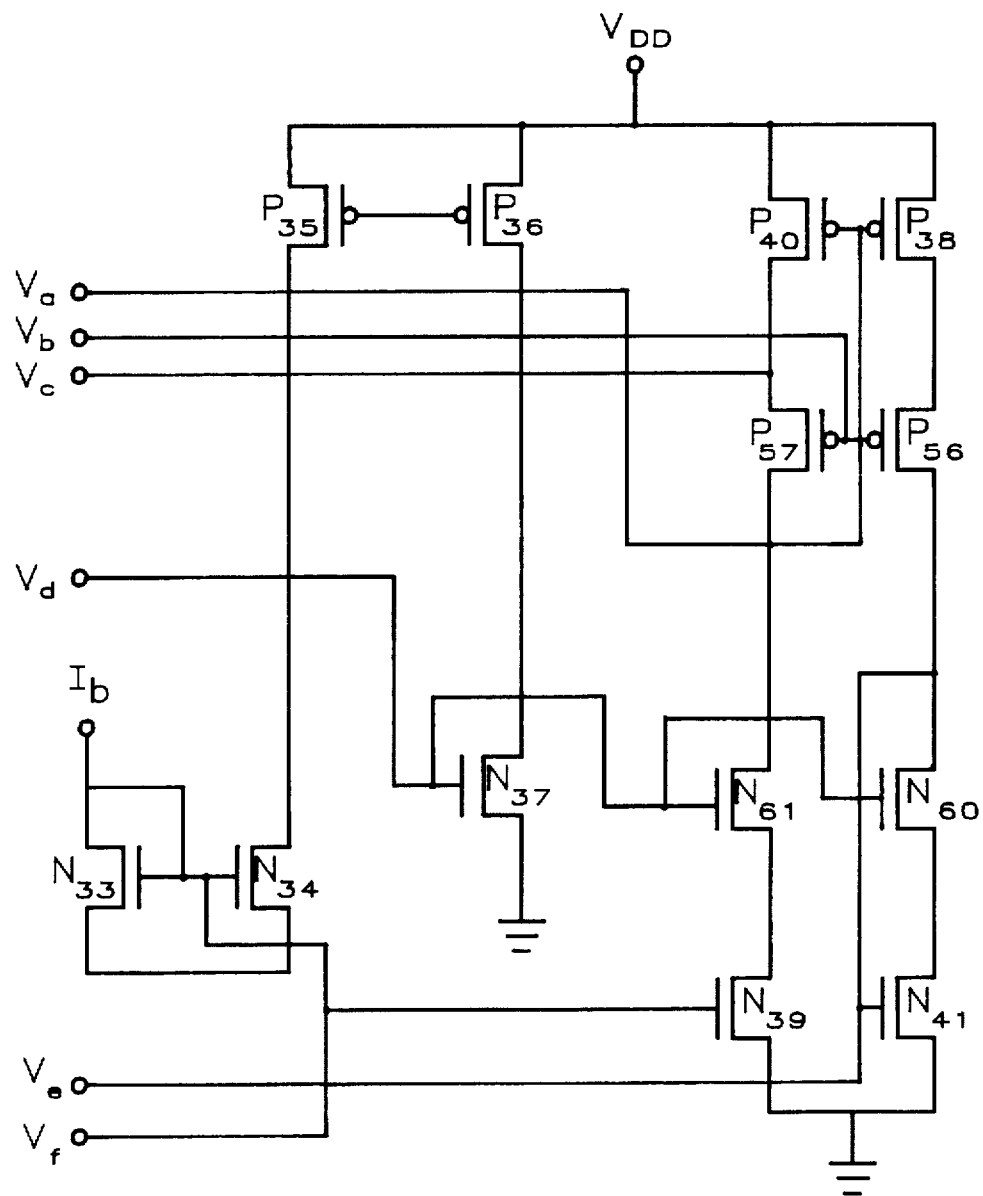
FIG. 5 is a schematic diagram of the voltage biasing section of the present invention.

The DC Voltage Biasing generator is shown in FIG. 5. Current $I_b$ passes through n-MOS FET $N_{33}$ which is connected in a diode configuration. The voltage developed at the drain and gate to source forms the voltage $V_f$. This voltage biases n-MOS FET's $N_{34}$ and $N_{39}$ to conduct with currents that are proportional to the current $I_b$. The current through $N_{34}$ serves as the input current for the diode connected p-MOS FET $P_{35}$. This establishes the voltage bias $V_b$ and serves to bias p-MOS FET $P_{57}$. The voltage bias $V_b$ also biases p-MOS FET $P_{56}$ which cascodes the current source p-MOS FET $P_{38}$ whose current is in proportion to the current through $P_{40}$. The current through $P_{40}$ and $P_{57}$ and n-MOS FET $N_{61}$ is driven by the current of n-MOS FET $N_{39}$. This resulted in the $V_c$ developed at the drain of $P_{57}$ and the gate of $P_{40}$. The p-MOS FET $P_{36}$ is also biased by voltage $V_b$ to conduct at a current level that is proportional to the current through $P_{35}$. This current develops the voltage $V_d$ across the diode connected n-MOS FET $N_{37}$. The voltage $V_d$ forms the bias for the n-MOS FET $N_{61}$ which forms a cascoded current source with n-MOS FET $N_{39}$. The voltage $V_d$ also forms the bias for the n-MOS FET $N_{60}$ which forms a cascoded diode connected configuration with n-MOS FET $N_{41}$. The current through $N_{60}$ and $N_{41}$ is established by the cascoded current source $P_{38}$ and $P_{56}$. This establishes voltage $V_e$ at the drain of $P_{56}$ and the drain of $N_{60}$.

The circuit this invention has been described using n-channel and p-channel MOS FET devices. It will be obvious to those skilled in the art that with appropriate changes in materials in the fabrication of this invention that the channel types may be reversed. Also, it will be apparent to those skilled in the art that this invention may be implemented as bipolar junction transistor. These and other changes in form and detail may be made without departing from the spirit and scope of the invention.

What is claimed is:

1. A cascoded differential amplifier coupled between a first and second power supply line to amplify a difference signal of the magnitude of a first and second input voltage signals, comprising:

a) a differential amplifier section for the amplification of the difference signal, comprising:

a differential pair having a first n-MOS FET and a second n-MOS FET, each comprising a drain, gate, and source, a positive input terminal to couple the first input voltage signal to the gate of the first n-MOS FET, a negative input terminal to couple the second input voltage signal to the gate of the second n-MOS FET, and a current source coupled between the sources of the first and second n-MOS FET's, a first biasing voltage and the second power supply line;

b) a current injection section for the injection of current to the differential amplifier section for the enhancement of the gain of the differential amplifier section;

c) a first current source load to develop a negative form of the difference signal, comprising:

a first p-MOS FET, comprising a gate, source, and drain, wherein the source is connected to the first power supply line and the gate is connected to a second biasing voltage;

d) a second current source load to develop a positive form of the difference signal, comprising:

a second p-MOS FET, comprising a gate, source, and drain, wherein the source is connected to the first power supply line and the gate is connected to the second biasing voltage;

e) an isolation circuit connected between the first and second current source load circuits and the differential amplifier, comprising:

a third n-MOS FET comprising a gate, drain, and source, wherein the source is connected to the drain of the first n-MOS FET, the drain is connected to the drain of the first p-MOS FET, and the gate is connected to a third biasing voltage, and a fourth n-MOS FET comprising a gate, drain and source, wherein the source is connected to the drain of the second n-MOS FET, the drain is connected to the drain of the second p-MOS FET, and the gate is connected to the third biasing voltage;

f) a negative output level translation circuit to buffer and translate the negative form of the difference signal, connected to a junction between the first current source load circuit and the first isolation circuit, comprising:

a third p-MOS FET comprising a gate, drain, and source, wherein the source is connected to the drain of the first p-MOS FET, and the gate is connected to a fourth biasing voltage.

a negative output terminal connected to the drain of the third p-MOS FET to transfer the negative form of the difference signal to external circuitry, a fifth n-MOS FET comprising a gate, drain, and source, wherein the drain is connected to the negative output terminal and the drain of the third p-MOS FET, and the gate is connected to a fifth biasing voltage, and a sixth n-MOS FET comprising a gate, drain, and source, wherein the drain is connected to the source of the fifth n-MOS FET, the source is connected to the second power supply line, and the gate is connected to a biasing sixth voltage;

g) a positive output level translation circuit to buffer and translate the positive form of the difference signal, connected to a junction between the second current source load circuit and the second isolation circuit, comprising:

a fourth p-MOS FET comprising a gate, drain, and source, wherein the source is connected to the drain of the second p-MOS FET, and the gate is connected to the fourth biasing voltage of the plurality of the voltages provided by the voltage biasing generator section;

a positive output terminal connected to the drain of the fourth p-MOS FET to transfer the positive form of the difference signal to external circuitry;

a seventh n-MOS FET comprising a gate, drain, and source, wherein the drain is connected to the positive output terminal and the drain of the fourth p-MOS FET, and the gate is connected to the fifth biasing voltage;

an eighth n-MOS FET comprising a gate, drain, and source, wherein the drain is connected to the source of the seventh n-MOS FET, the source is connected to the second power supply line, and the gate is connected to the sixth biasing voltage;

h) a voltage biasing generator section to provide a plurality of voltages to the differential amplifier sections, the current injection section, the first and second current source loads, the isolation circuit, and the negative and positive output level translation circuit to adjust the gain of the differential amplifier sections, to adjust the injected current from the current injection section, and to establish an output level of the negative and positive output level translation circuits.

2. The cascoded differential amplifier of claim 1 wherein the voltage biasing generator section comprises multiple p-MOS FET's and n-MOS FET's configured such as to provide the first through sixth biasing voltages.

3. The cascoded differential amplifier of claim 1 wherein the current injection section comprises a) a first cascoded current source for the injection of a first injection current to the differential amplifier;

b) a second cascoded current source for the injection of a second injection current to the differential amplifier;

c) a first current injection terminal connected to the drain of the first n-MOS FET to inject the first injection current to the differential amplifier; and d) a second current injection terminal connected to the drain of the second n-MOS FET to inject the second injection current to the differential amplifier.

4. The cascoded differential amplifier of claim 1 wherein the current source comprises:

a) a ninth n-MOS FET, comprising a gate, drain, and source, wherein the drain is connected to the sources of the first and second n-MOS FET's, the source is connected to the second power supply line, and the gate is connected to the first biasing voltage.

5. The cascoded differential amplifier of claim 1 wherein the positive form of the difference signal and the negative form of the difference signal have an opposite phase.

6. The cascoded differential amplifier of claim 1 wherein the negative output level translation circuit translates and buffers the negative form of the difference signal to a voltage level suitable for placement on the negative output terminal.

7. The cascoded differential amplifier of claim 1 wherein the positive output level translation circuit translates and buffers the positive form the difference signal to a voltage level suitable for placement on the positive output terminal.

8. The cascoded differential amplifier of claim 1 wherein the third and fourth n-MOS FET's enable a transconductance parameter of the first and second n-MOS FET's to be enhanced by the current injected from the current injection section.

9. A cascoded differential amplifier to amplify a difference signal of a positive and a negative input voltage signal comprising:

a) a differential pair having a first n-MOS FET and a second n-MOS FET, each comprising a gate, drain, and source;

b) a positive input terminal to couple the positive input voltage signal to the gate of the first n-MOS FET;

c) a negative input terminal to couple the negative input voltage signal to the gate of the second n-MOS FET;

d) a current source connected to the sources of the first and second n-MOS FET's, which have their sources coupled together;

e) a first isolation circuit connected to the drain of the first n-MOS FET;

f) a second isolation circuit connected to the drain of the second n-MOS FET;

g) a first current source load connected to the first isolation circuit to develop a negative difference signal;

h) a second current source load connected to the second isolation circuit to develop a positive difference signal;

i) a positive output level translation circuit connected to the connection of the second current source load circuit and the second isolation circuit to translate and buffer the positive difference signal, wherein said positive output level translation circuit comprises;

a first p-MOS FET comprising a gate, drain, and source, wherein the source is connected the second current source load, and the gate is connected to a first biasing voltage, a positive output terminal connected to the drain of the first p-MOS FET to transfer the positive form of the difference signal to external circuitry, a third n-MOS FET comprising a gate, drain, and source, wherein the drain is connected to the positive output terminal and the drain of the first p-MOS FET, and the gate is connected to a second biasing voltage, and a fourth n-MOS FET comprising a gate, drain, and source, wherein the drain is connected to the source of the third n-MOS FET, the source is connected to the second power supply line, and the gate is connected to a third biasing voltage;

j) a negative output level translation circuit connected to the connection of the first current source load circuit and the first isolation circuit to translate and buffer the negative difference signal, wherein said negative output level translation circuit comprises;

a second p-MOS FET comprising a gate, drain, and source, wherein the source is connected the first current source load, and the gate is connected to the first biasing voltage, a negative output terminal connected to the drain of the second p-MOS FET to transfer the negative form of the difference signal to external circuitry, a fifth n-MOS FET comprising a gate, drain, and source, wherein the drain is connected to the negative output terminal and the drain of the second p-MOS FET, and the gate is connected to the second biasing voltage, and a sixth n-MOS FET comprising a gate, drain, and source, wherein the drain is connected to the source of the fifth n-MOS FET, the source is connected to the second power supply line, and the gate is connected to the third biasing voltage;

k) a current injection section for the injection of a first current to the connection between the drain, of the first n-MOS FET and the first isolation circuit, and for the injection of a second current to the connection between the drain of the second n-MOS FET and the second isolation circuit; and l) a voltage biasing generation section for the generation of a plurality of voltages wherein the voltages are connected to the current source, first and second isolation circuits, the first and second load circuits, the current injection section, and the positive and negative output translation circuits to form the first, second, and third biasing voltage.

10. The cascoded differential amplifier of claim 9 wherein the current source comprises:

a) a seventh n-MOS FET, comprising a gate, drain, and source, wherein the drain is connected to the sources of the first and second n-MOS FET's, the source is connected to the second power supply line, and the gate is connected to a fourth biasing voltage.

11. The cascoded differential amplifier of claim 9 wherein the first and the second current source load circuits comprise:

a) a third p-MOS FET, comprising a gate, source, and drain, wherein the drain is connected to the first isolation circuit, the source is connected to the first power supply line, and the gate is connected to a fifth biasing voltage;

b) a fourth p-MOS FET, comprising a gate, source, and drain, wherein the drain is connected to the second isolation circuit, the source is connected to the first power supply line, and the gate is connected to the fifth biasing voltage.

12. The cascoded differential amplifier of claim 9 wherein the current injection section comprises:

a) a first cascoded current source for the injection of a first injection current to the differential amplifier;

b) a second cascoded current source for the injection of a second injection current to the differential amplifier;

c) a first current injection terminal connected to the drain of the first n-MOS FET to inject the first injection current to the differential amplifier; and d) a second current injection terminal connected to the drain of the second n-MOS FET to inject the second injection current to the differential amplifier.

13. The cascoded differential amplifier of claim 10 wherein the fourth biasing voltage adjusts the magnitude of the constant current generated by the current source.

14. The cascoded differential amplifier of claim 11 wherein the first isolation circuit isolates the first n-MOS FET from the first current source load circuit and comprises:

a) a seventh n-MOS FET comprising a gate, drain, and source, wherein the source is connected to the drain of the first n-MOS FET, the drain is connected to the drain of the third p-MOS FET, and the gate is connected to a sixth biasing voltage.

15. The cascoded differential amplifier of claim 14 wherein the second isolation circuit isolates the second n-MOS FET from the second current source load circuit and comprises:

a) an eighth n-MOS FET comprising a gate, drain, and source, wherein the source is connected to the drain of the second n-MOS FET, the drain is connected to the drain of the fourth P-MOS FET, and the gate is connected to a sixth biasing voltage.

* * * * *